(12) United States Patent  (10) Patent No.: US 8,252,649 B2
Stahrenberg et al.  (45) Date of Patent: Aug. 28, 2012

(54) METHODS OF FABRICATING SEMICONDUCTOR DEVICES AND STRUCTURES THEREOF

(75) Inventors: Knut Stahrenberg, Wappingers Falls, NY (US); Jin-Ping Han, Fishkill, NY (US)

(73) Assignee: Infineon Technologies AG, Neubiberg (DE)

( * ) Notice: Subject to any disclaimer, the term of this patent is extended or adjusted under 35 U.S.C. 154(b) by 539 days.

(21) Appl. No.: 12/341,542

(22) Filed: Dec. 22, 2008

(65) Prior Publication Data

US 2010/0155854 A1   Jun. 24, 2010

(51) Int. Cl.
 *H01L 21/00* (2006.01)
(52) U.S. Cl. ........................................ 438/275; 438/276
(58) Field of Classification Search ........... 438/275–277
 See application file for complete search history.

(56) References Cited

U.S. PATENT DOCUMENTS

| | | | | |
|---|---|---|---|---|
| 5,432,114 A * | 7/1995 | O | | 438/217 |
| 5,672,521 A * | 9/1997 | Barsan et al. | | 438/276 |
| 5,942,780 A * | 8/1999 | Barsan et al. | | 257/321 |
| 6,238,982 B1 | 5/2001 | Krivokapic et al. | | |
| 6,448,590 B1 | 9/2002 | Adkisson et al. | | |
| 6,835,622 B2 * | 12/2004 | Yeh et al. | | 438/275 |
| 7,074,680 B2 * | 7/2006 | Doczy et al. | | 438/287 |
| 7,223,679 B2 * | 5/2007 | Murthy et al. | | 438/592 |
| 7,253,050 B2 | 8/2007 | Luan et al. | | |
| 7,344,934 B2 | 3/2008 | Li | | |
| 7,361,538 B2 | 4/2008 | Luan et al. | | |
| 7,462,538 B2 | 12/2008 | Li et al. | | |
| 2005/0280104 A1 | 12/2005 | Li | | |
| 2005/0282329 A1 | 12/2005 | Li | | |
| 2006/0131652 A1 | 6/2006 | Li | | |
| 2007/0052036 A1 | 3/2007 | Luan et al. | | |
| 2007/0052037 A1 | 3/2007 | Luan | | |
| 2007/0075351 A1 | 4/2007 | Schulz et al. | | |
| 2007/0131972 A1 | 6/2007 | Li | | |
| 2008/0050898 A1 | 2/2008 | Luan | | |

* cited by examiner

*Primary Examiner* — Richard A. Booth
(74) *Attorney, Agent, or Firm* — Slater & Matsil, L.L.P.

(57) ABSTRACT

Methods of fabricating semiconductor devices and structures thereof are disclosed. In one embodiment, a method of manufacturing a semiconductor device includes forming a gate material stack over a workpiece having a first region and a second region. A composition or a thickness of at least one of a plurality of material layers of the gate material stack is altered in at least the second region. The gate material stack is patterned, forming a first transistor in the first region and forming a second transistor in the second region. Altering the composition or the thickness of the at least one of the plurality of material layers of the gate material stack in at least the second region results in a first transistor having a first threshold voltage and a second transistor having a second threshold voltage, the second threshold voltage having a different magnitude than the first threshold voltage.

5 Claims, 4 Drawing Sheets

METHODS OF FABRICATING SEMICONDUCTOR DEVICES AND STRUCTURES THEREOF

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

What are needed in the art are improved methods of fabricating semiconductors that include transistors and structures thereof.

SUMMARY OF THE INVENTION

These and other problems are generally solved or circumvented, and technical advantages are generally achieved, by embodiments of the present invention, which provide novel methods of manufacturing semiconductor devices and structures thereof.

In accordance with one embodiment, a method of manufacturing a semiconductor device includes forming a gate material stack over a workpiece, the workpiece having a first region and a second region. The gate material stack includes a plurality of material layers. A composition or a thickness of at least one of the plurality of material layers of the gate material stack is altered in at least the second region of the workpiece. The gate material stack in at least the first region and the second region of the workpiece is patterned, forming a first transistor in the first region of the workpiece and forming a second transistor in the second region of the workpiece. Altering the composition or the thickness of the at least one of the plurality of material layers of the gate material stack in at least the second region of the workpiece results in a first transistor having a first threshold voltage and a second transistor having a second threshold voltage. The second threshold voltage has a different magnitude than the first threshold voltage.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
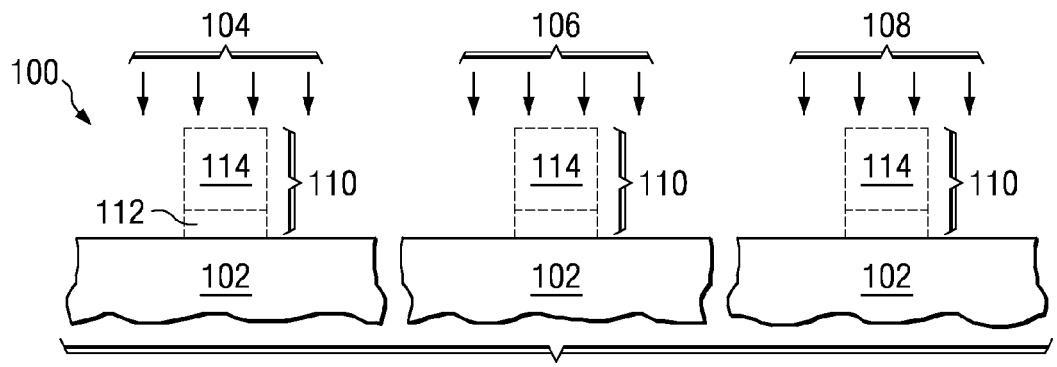
FIG. 1 is a cross-sectional view of a prior art semiconductor device having transistors with different threshold voltages, wherein the different threshold voltages are formed by implanting dopants into the surface of a workpiece before or after gate stack materials are deposited.

Some semiconductor device 100 designs require multiple transistors having various threshold voltages (Vt's) across the surface of a workpiece 102, as shown in FIG. 1, which shows a prior art semiconductor device 100. Some designs may require the use of both low leakage transistors, which require high threshold voltages, and also fast transistors, which require a low threshold voltage, on a single chip, for example. Other transistors may also be required to be formed on the same chip having regular or medium levels of threshold voltage, for example. The various threshold voltages are typically achieved in the prior art using different implantation processes 104, 106, and 108 wherein different impurities or concentrations of impurities are implanted into the surface of the workpiece 102 in each transistor region, before a gate material stack 110 including a gate dielectric 112 and gate material 114 is formed over the workpiece 102. Other implantation processes 104, 106, and 108 may also be used after the formation and patterning of the gate material stack 110 to form the source and drain regions of the transistors and which may also be used to establish the threshold voltage of the transistors.

A problem with the prior art method shown in FIG. 1 of establishing different threshold voltages for a semiconductor device 100 is that an additional masking level is required for each type of transistor formed on the workpiece 102. In a semiconductor device design requiring three threshold voltages for n channel MOS (NMOS) transistors and three threshold voltages for p channel MOS (PMOS) transistors, six mask levels are required, for example. In other designs, more or fewer mask levels are required to implant substances to the workpiece to establish the threshold voltage of transistors. The additional mask levels in the fabrication process are costly and time-consuming. Furthermore, implanting impurities into the workpiece 102 in the channel region or source and drain regions can cause damage to the workpiece 102 that deleteriously impacts device 100 performance.

Thus, methods of establishing multiple threshold voltages for transistors of semiconductor devices are needed in the art.

The present invention will be described with respect to preferred embodiments in specific contexts, namely implemented in semiconductor devices including a plurality of NMOS or PMOS transistors. Embodiments of the invention may also be implemented in other semiconductor applications such as memory devices, logic devices, complementary metal oxide semiconductor (CMOS) devices, and other applications that utilize transistor devices, for example.

Embodiments of the present invention provide novel methods of fabricating transistor devices, wherein different threshold voltage levels are established for multiple transistors across a surface of a semiconductor device by altering a thickness or composition of one or more material layers of gate material stacks of the transistors. The need to implant the workpiece with impurities to establish the threshold voltages is avoided. Fewer mask levels are advantageously required to achieve multiple threshold voltages for transistors of semiconductor devices in accordance with embodiments of the present invention.

Figure 2:
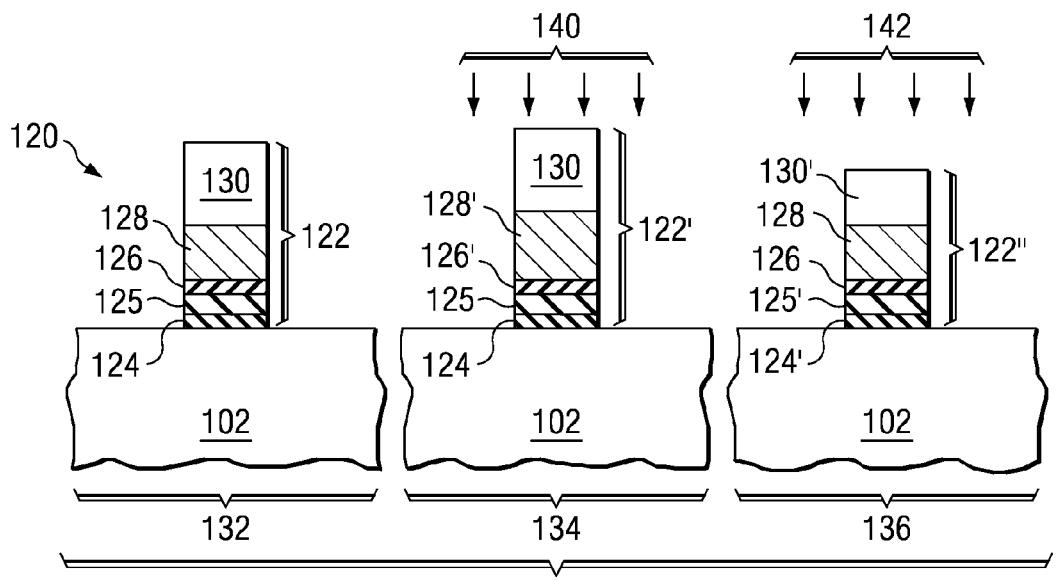
FIG. 2 shows a cross-sectional view of an embodiment of the present invention, wherein different magnitudes of threshold voltages for a plurality of transistors are achieved by altering the thickness or composition of one or more material layers of a gate material stack of a semiconductor device using two or more processes.
Figure 3:
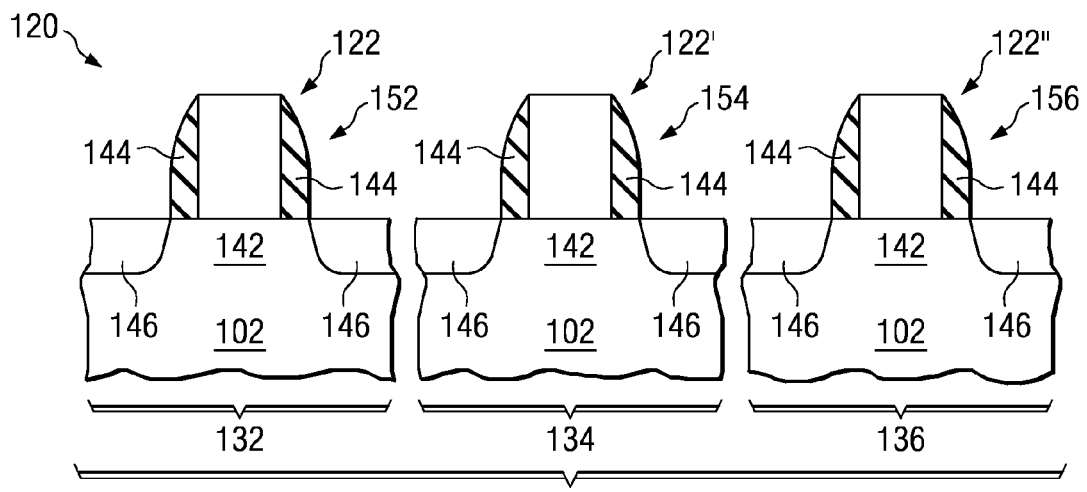
FIG. 3 shows a cross-sectional view of the embodiment shown in FIG. 2 after the formation of sidewall spacers and source and drain regions of the plurality of transistors.

FIGS. 2 and 3 show cross-sectional views of an embodiment of the present invention, wherein different magnitudes of threshold voltages for a plurality of transistors 152, 154, and 156 in a first region 132, second region 134, and third region 136, respectively, of a workpiece 102 are achieved by altering one or more material layers 124, 125, 126, 128, and 130 of a gate material stack 122 of a semiconductor device 120 using one or more processes 140 and 142. To manufacture the semiconductor device 120, first, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Isolation regions (not shown in FIGS. 2 and 3; see FIG. 4 at 156) are formed in the workpiece 102. The isolation regions 156 may comprise shallow trench isolation (STI) regions, deep trench (DT) isolation regions, field oxide (FOX) isolation regions, or other insulating regions, as examples. The isolation regions 102 may be formed by etching trenches in the workpiece 100 using lithography and filling the trenches with one or more insulating materials, for example.

As one example, the isolation regions 156 may be formed by depositing a hard mask (not shown) over the workpiece 102 and forming trenches in the workpiece 102 and the hard mask using a lithography process. The isolation regions 156 may be formed by depositing a photoresist over the hard mask, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple layers and combinations thereof, as examples. The hard mask may then be removed. Alternatively, the isolation regions 156 may be formed using other methods and may be filled with other materials.

A gate stack material 122 is formed over the workpiece 102. The gate stack material 122 may comprise an optional interfacial layer 124, a gate dielectric material 125, an optional cap layer 126, a metal gate material 128, and a semiconductive gate material 130, as shown in first region 132. The composition or thickness of at least one of the material layers 124, 125, 126, 128, and 130 of the gate stack material 122 in the second region 134 and third region 136 of the workpiece 102 is altered using one or more processes 140 or 142, causing a difference in magnitude of threshold voltages of transistors 152, 154, and 156 formed in regions 132, 134, and 136, to be described further herein.

Although the gate material stacks 122, 122' and 122" are shown after they are patterned in FIG. 2, the processes 140 and 142 are performed on the various material layers 124, 125, 126, 128, and 130 after they are deposited, before they are patterned. After the final material layer 130 is deposited and optionally exposed to a process 140 or 142, the gate material stacks 122, 122' and 122" are then patterned.

Furthermore, process 140 in the second region 134 may comprise a plurality of processes performed on material layers 126' and 128' of gate material stack 122'. Process 142 in the third region 134 may comprise a plurality of processes performed on material layers 125', 126', and 130' of material stack 122". Some of the plurality of processes 140 and 142 may comprise the same processes and may be performed at the same time for more than one region 132, 134, and 136, not shown.

The composition or thickness of one or more material layers 124, 125, 126, 128 and 130 of the gate stack material 122 in the first region 132 may also be altered using a process similar to processes 140 and 142 or the same as processes 140 and 142 to be described herein, for example, not shown.

The gate stack material 122 may be formed by first forming an optional interfacial layer 124 over the workpiece 102. The interfacial layer 124 improves the adhesion and formation of the gate dielectric material 125, particularly in applications wherein the gate dielectric material 125 comprises a high k dielectric material, for example. In some embodiments, the interfacial layer 124 comprises a thin layer of silicon oxide comprising a thickness of about 5 to 15 Angstroms. Alternatively, the interfacial layer 124 may comprise other materials and dimensions. The interfacial layer 124 may be formed by oxidizing the workpiece 102 surface, a sputtering process, exposing the workpiece 102 surface to an ultraviolet (UV) lamp in the presence of ozone or other oxygen source, a thermal oxidation process, a flash anneal process, or using a cleaning process, as examples, although the interfacial layer 124 may be formed using other methods. The material and thickness of the interfacial layer 124 has an effect on the threshold voltage of the transistor 152 formed in the first region 132, and also has an effect on the threshold voltages of transistors 154 and 156 formed in second region 134 and third region 136, respectively.

The composition or thickness of the interfacial layer 124 may be altered using a process 142 in the third region 136, forming an interfacial layer 124' that is different than interfacial layer 124 in the first region 132 and the second region 134. The material, thickness, and grading profile of the altered interfacial layer 124' has an effect on the threshold voltage of the transistor 156 formed in the third region 136 and causes the threshold voltage of transistor 156 in the third region to comprise a different magnitude than the threshold voltage of transistor 152 in the first region 132. The composition or thickness of the interfacial layer 124 in the first region 132 and/or second region 134 may also be altered, for example, not shown.

The process 142 may comprise an implantation of a dopant or other substance, and in some embodiments comprises implantation of nitrogen. The process 142 may also comprise nitriding the surface of the interfacial layer 124' using a plasma process. Plasma nitriding the surface of the interfacial layer 124' results in more nitrogen being introduced at the top surface than in the lower portion of the interfacial layer 124', which may impact the threshold voltage differently than an implantation process, wherein the dopant or substance may be implanted deeper or more evenly through the interfacial layer 124', for example. The process 142 may alternatively comprise in-situ doping nitrogen. The process 142 may alternatively comprise introducing other substances using an implantation process, plasma process, or in-situ doping process, such as C, In, Fl, Cl, or other substances into the interfacial layer 124' in the third region 136.

Introducing the substance to the interfacial layer 124' may result in a graded profile of the substance within the interfacial layer 124', which alters the threshold voltage in the third region 136. The grading profile, e.g., having more of the substance at the top surface than at the bottom surface, or having more of the substance at the bottom surface than at the top surface, has an effect on the threshold voltage of a transistor 156 formed in the third region 136, and the grading profile of the substance within the interfacial layer 124' may be used to tune the threshold voltage, in accordance with embodiments of the present invention.

The process 142 may alternatively comprise increasing or decreasing the thickness of the interfacial layer 124', using a deposition or growth process to increase the thickness, or using an etch process or cleaning process to decrease the thickness, as examples.

The first region 132 and the second region 134 of the workpiece 102 may be masked using a masking material such as a layer of photoresist during the process 142, for example, not shown. After the process 142 to alter the interfacial layer 124 in the third region 136, the masking material is removed.

A gate dielectric material 125 is deposited over the interfacial layer 124, if present, or over the workpiece 102, if the interfacial layer 124 is not included in the gate material stack 122. The gate dielectric material 125 may comprise about 10 to 50 Angstroms of an oxide such as $SiO_2$, a nitride such as $Si_3N_4$, a high-k dielectric material having a dielectric constant or k value of greater than about 3.9, such as a hafnium-based dielectric material (e.g., HfSiON, HfO, or HfSiO), a doped hafnium-based dielectric material, a zirconium-based dielectric material, a doped zirconium-based dielectric material, a HfZr mixture, a doped HfZr mixture, SrTO, TaO, BTO, other high-k dielectric materials, or combinations and multiple layers thereof, as examples. Alternatively, the gate dielectric material 125 may comprise other dimensions and materials, for example. The gate dielectric material 125 may be formed using thermal oxidation, chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used to form the gate dielectric material 125.

The composition or thickness of the gate dielectric material 125 may be altered using a process 142 in the third region 136, forming a gate dielectric material 125' that is different than gate dielectric material 125 in the first region 132 and the second region 134. The material, thickness, and grading profile of the altered gate dielectric material 125' has an effect on the threshold voltage of the transistor 156 formed in the third region 136 and causes the threshold voltage of transistor 156 in the third region to comprise a different magnitude than the threshold voltage of transistor 152 in the first region 132. The composition or thickness of the gate dielectric material 125 in the first region 132 and/or second region 134 may also be altered, for example, not shown.

The process 142 may comprise introducing a substance into the gate dielectric material 125' in the third region 136 such as N, C, In, Fl, Cl, or other substances using an implantation process, a plasma process, or an in-situ doping process. Introducing the substance may result in a graded profile that affects or alters the threshold voltage in the third region 136, for example. The process 142 may alternatively comprise increasing or decreasing the thickness of the gate dielectric material 125' using a deposition or growth process to increase the thickness, or using an etch process to decrease the thickness, for example.

The first region 132 and the second region 134 of the workpiece 102 may be masked using a masking material such as a layer of photoresist during the process 142 to alter the gate dielectric material 125', for example, not shown. After the process 142 to alter the gate dielectric material 125' in the third region 136, the masking material is removed.

Figure 5:
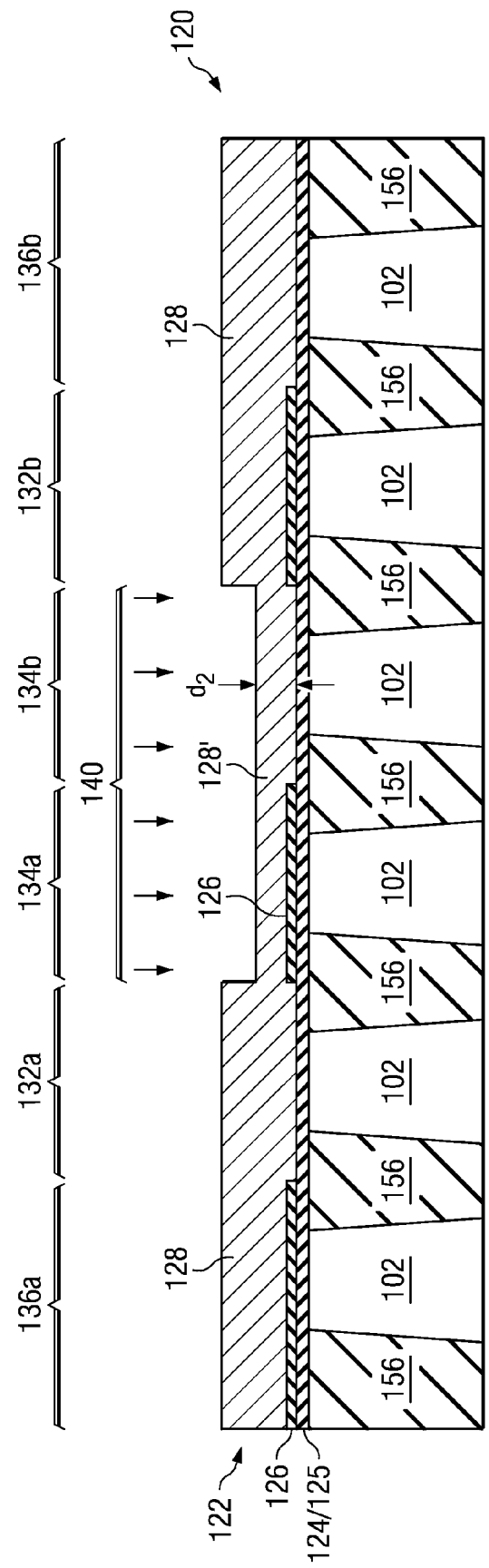

An optional cap layer 126 may be formed over the gate dielectric material 125, as shown in FIG. 5. The cap layer 126 may have a thickness of about 0.5 to 5 nm and may comprise LaO, DyO, MoO, MgO, or AlO, as examples. Alternatively, the cap layer 126 may comprise other materials and dimensions. The material and thickness of the cap layer 126 has an effect on the threshold voltage of the transistor 152 formed in the first region 132, and also has an effect on the threshold voltages of transistors 154 and 156 formed in the second and third regions 134 and 136. The cap layer 126 may be different for p channel metal oxide semiconductor (PMOS) and n channel metal oxide semiconductor (NMOS) transistors of the semiconductor device 120.

The composition or thickness of the cap layer 126 may be altered using a process 140 in the second region 134, forming a cap layer 126' that is different than the cap layer 126 in the first region 132 and the third region 136. The material, thickness, and grading profile of the altered cap layer 126' has an effect on the threshold voltage of the transistor 154 formed in the second region 134 and causes the threshold voltage of transistor 154 in the second region 134 to comprise a different magnitude than the threshold voltage of transistor 152 in the first region 132. The composition or thickness of the cap layer 126 in the first region 132 and/or the third region 136 may also be altered using the process 140, for example, not shown.

The process 140 may comprise a similar process as described for processes 142 in the third region 136. For example, the process 140 may comprise an implantation of a dopant or other substance, and in some embodiments comprises implantation or in-situ doping of nitrogen. The process 142 may also comprise nitriding the surface of the cap layer 126' using a plasma process. As described for the process 142 for the interfacial layer 124, the grading profile may impact or affect the threshold voltage. The process 140 may alternatively comprise introducing other substances such as C, In, Fl, Cl, or other substances into the cap layer 126' in the second region 134 using an implantation process, in-situ doping process, or plasma process. The process 140 may alternatively comprise increasing or decreasing the thickness of the cap layer 126' using a deposition or growth process to increase the thickness, or using an etch process to decrease the thickness, as examples. In some embodiments, the cap layer 126' may be completely removed from some regions of the semiconductor device, as shown in the embodiment shown in FIGS. 4 through 8 in regions 132a, 134b, and 136b.

Referring again to FIG. 2, also as described for process 142, the first region 132 and the third region 136 of the workpiece 102 may be masked using a masking material such as a layer of photoresist during the process 140 to alter the cap layer 126', for example, not shown. After the process 140 to alter the cap layer 126' in the second region 134, the masking material is removed.

A metal gate material 128 is formed over the cap layer 126, as shown in FIG. 2. The metal gate material 128 may comprise about 10 to 120 nm of TiN, TaN, TiC, TiCN, MoN, other metals, or combinations and/or multiple layers thereof, as examples, although alternatively, the metal gate material 128 may comprise other materials and dimensions. The metal gate material 128 may be formed by CVD, PVD, or other methods, as examples.

The metal gate material 128 may be exposed to a process 140 or 142 previously described herein to alter the composition or thickness in the second region 134 or third region 136, resulting in a change in the threshold voltage value of transistors 154 and 156 formed in those regions 134 and 136. In the example shown in FIG. 2, the thickness of the metal gate material 128' in the second region 134 has been increased, e.g., by depositing additional metal gate material 128' over the workpiece 102 while the first region 132 and third region 136 are masked. The masking material is removed and in a lift-off method, the additional metal gate material is removed from the first region 132 and third region 136, resulting in a metal gate material 128' in the second region 134 that has a greater thickness than the metal gate material 128 in the first region 132 and third region 136. Alternatively, the metal gate material 128' may be decreased in thickness using an etch process, or the metal gate material 128' composition may be altered by an implantation process, in-situ doping process, or plasma process, as described for processes 140 and 142 herein. The material, thickness, and grading profile of the altered metal gate material 128' has an effect on the threshold voltage of the transistor 154 formed in the second region 134 and causes the threshold voltage of transistor 154 in the second region 134 to comprise a different magnitude than the threshold voltage of transistor 152 in the first region 132.

A semiconductive gate material 130 is formed or deposited over the metal gate material 128. The semiconductive gate material 130 may comprise about 10 to 200 nm of a semiconductive material such as polysilicon, amorphous silicon, polySiGe, or other semiconductor materials, although alternatively, the semiconductive gate material 130 may comprise other dimensions and semiconductor materials. In some embodiments, the semiconductive gate material 130 may comprise a thickness of about 50 nm, as an example. The semiconductive gate material 130 may be formed by CVD, PVD, or other methods, as examples. The semiconductive gate material 130 may optionally be implanted with dopants; e.g., the semiconductive gate material 130 may be predoped or may be doped later, at the same time source and drain regions 146 (see FIG. 3) of the transistors 152, 154, and 156 are implanted with dopants.

In the embodiment shown in FIG. 2, the first and second regions 132 and 134 are masked, and the third region 136 of the workpiece 102 is subjected to a process 142 to alter the composition or thickness of the semiconductive gate material 130' in the third region 136. The thickness of the semiconductive gate material 130' is reduced in the example shown, which alters the threshold voltage of transistor 156 formed in the third region 136. Alternatively, or additionally, the semiconductive gate material 130' may be increased in thickness, implanted with a substance, treated with a plasma process, or in-situ doped using the processes 140 or 142 described herein. The material, thickness, and grading profile of the altered semiconductive gate material 130' has an effect on the threshold voltage of the transistor 156 formed in the third region 136 and causes the threshold voltage of transistor 156 in the third region 136 to comprise a different magnitude than the threshold voltage of transistor 152 in the first region 132.

In some embodiments, two or more processes 140 or 142 are performed in at least one region 132, 134, and 136 of the workpiece 102. The embodiment shown in FIG. 2 is only an example of combinations of particular processes 140 and 142 that may be performed on a semiconductor device 120 in various regions 134 and 136; advantageously, a plurality of processes 140 or 142 described herein may be performed on one or more of the material layers 124, 125, 126, 128, and 130 of the gate material stacks 122, 122', and 122" in one or more regions 132, 134, and 136 in various combinations to achieve the desired threshold voltages of transistors 152, 154, and 156. In some embodiments, only one material layer 124, 125, 126, 128, and 130 of the gate material stacks 122, 122' or 122" is altered. In other embodiments, two, three, four, or all material layers 124, 125, 126, 128, and 130 of the gate material stacks 122, 122", or 122" are altered, for example. A combination of processes 140 and 142 may be selected for particular material layers 124, 125, 126, 128, and 130 of the gate material stacks 122, 122', and 122" to achieve the different magnitudes of threshold voltages for transistors 152, 154, and 156 desired.

In some embodiments, the difference in threshold voltage magnitudes between regions 132, 134, and 136 may range from about 50 mV to about 500 mV. In other embodiments, the difference in threshold voltage magnitudes between regions 132, 134, and 136 may vary by about 100 mV, as another example. The threshold voltage differences of the transistors 152, 154, and 156 may alternatively range by other values, depending on the applications.

There may be two or more different threshold voltage transistor types formed across a surface of a workpiece 102, for example. In FIGS. 2 and 3, only three regions 132, 134, and 136 are shown. In some embodiments, three transistor 152, 154, and 156 types may be required for NMOS devices of the semiconductor device 120: high voltage transistor devices 152 having a threshold voltage of about 500 mV; medium voltage transistor devices 154 having a threshold voltage of about 250 mV; and low voltage transistor devices 156 having a threshold voltage of about 100 mV, as an example. Alternatively, the threshold voltage ranges of the transistors 152, 154, and 156 may comprise other values.

However, there may be more than three regions 132, 134, and 136 having different threshold voltages across a surface of a workpiece 102. For example, in other embodiments, five transistor types for NMOS devices may be required on a single semiconductor device 120 or chip; high voltage transistor devices 152, medium voltage transistor devices 154, low voltage transistor devices 156, super-low voltage transistor devices (not shown) having a threshold value of less than about 50 mV, and zero voltage transistor devices (also not shown) having a threshold value of about 0 mV. In some embodiments, six or more transistor types having different threshold voltage magnitudes may be formed on a single semiconductor device 120, for example.

PMOS devices may also be required on a single semiconductor device 120 having two or more threshold voltage levels required for various device types. Advantageously, many different threshold voltage levels and magnitudes of threshold voltages are achievable using one or more of the processes 140 and 142 on one or more material layers 124, 125, 126, 128, and 130 of gate material stacks 122, 122', and 122" in one or more regions 132, 134, and 136 of a workpiece 102 in accordance with embodiments of the present invention. In some embodiments, asymmetric threshold voltages of transistors 152, 154, and 156 in the various regions 132, 134, and 136 of the semiconductor device 120 are achieved.

After the processes 140 and 142 are performed on one or more material layers 124, 125, 126, 128, and 130 of the gate material stacks 122, 122', and 122", the gate material stacks 122, 122', and 122" are patterned, leaving the structure shown in FIG. 2. FIG. 3 shows transistor 152 in the first region 132 including gate stack material 122, transistor 154 in the second region 134 including gate stack material 122', and transistor 156 in the third region 136 including gate stack material 122" after the formation of sidewall spacers 144 comprising one or more insulating materials formed on sidewalls of the gate material stacks 122, 122' and 122". Source and drain regions 146 of the transistors 152, 154, and 156 are formed proximate the patterned gate stack materials 122, 122', and 122", as shown.

Insulating material layers and conductive material layers may be formed over the semiconductor device 120 and patterned to complete the fabrication process. Metallization layers (not shown) may be formed that make electrical contact to the source and drain regions 146 and gate electrodes 128/130, 128'/130, and 128/130' (see FIG. 2) and interconnect the various components of the semiconductor device 120. Contacts and bond pads may be coupled to the conductive material layers, and individual die of the workpiece 102 may be singulated and packaged, for example, not shown.

Note that if the processes 140 or 142 comprise implantation processes, in-situ doping processes, or plasma processes, anneal processes may be used to cause diffusion of the dopants or substances implanted into the material layers 124, 125, 126, 128, and 130 of the gate material stacks 122, 122', and 122", for example. The thermal budgets for each material layer 124, 125, 126, 128, and 130 of the gate material stacks 122, 122', and 122" may also have an impact on the threshold voltage of the transistors 152, 154, and 156.

In some embodiments, at least one of the processes 140 or 142 comprises introducing a substance to at least a surface of at least one of the plurality of material layers 124, 125, 126, 128 and 130 of the gate material stack 122, resulting in a graded profile of the at least one of the plurality of material layers 124, 125, 126, 128 and 130 of the gate material stack 122' or 122", which causes a difference in threshold voltages in two regions 132, 134, or 136 of a semiconductor device 120. The substance introduced may comprise N, C, In, Cl, or Fl, as examples, although alternatively, other substances may be introduced to vary the threshold voltage. A thickness of at least one of the plurality of material layers 124, 125, 126, 128 and 130 of the gate material stack 122 may further be altered, which contributes to the difference between the threshold voltages of the transistors 152, 154, or 156.

In some embodiments, the threshold voltage difference of the transistors 152 and 154 is created by altering a thickness or introducing a substance to the semiconductive gate material 130 of the gate material stack 122 in one of the regions 132, 134, or 136. For example, in FIG. 2, semiconductive gate material 130' in the third region 136 is decreased relative to a thickness of semiconductive gate material 130 in the first and second region 132 and 134. The altered thickness of the semiconductive gate material 130' or the substance introduced causes the threshold voltage difference between transistors 152, 154, and 156 formed.

FIGS. 4 through 8 show cross-sectional views of a semiconductor device 120 at various stages of manufacturing in accordance with one embodiment of the present invention, wherein multiple thicknesses of a metal gate material 128/128' are used to create different threshold voltages for a plurality of transistors 152a, 154a, 156a, 152b, 154b, and 156b across a surface of a workpiece 102. Like numerals are used for the various elements that were described in FIGS. 2 and 3. To avoid repetition, each reference number shown in FIGS. 4 through 8 is not described again in detail herein.

In this embodiment, six different transistor device types 152a, 152b, 154a, 154b, 156a, and 156b are formed by removing the cap layer 126 from the gate material stack 122 in some regions 132a, 134b, and 136b, by reducing a thickness of the metal gate material of the gate material stack 122 by a first amount in some regions 134a and 134b, and by reducing a thickness of the metal gate material 128 of the gate material stack 122 by a second amount in other regions 136a and 136b.

Figure 4:
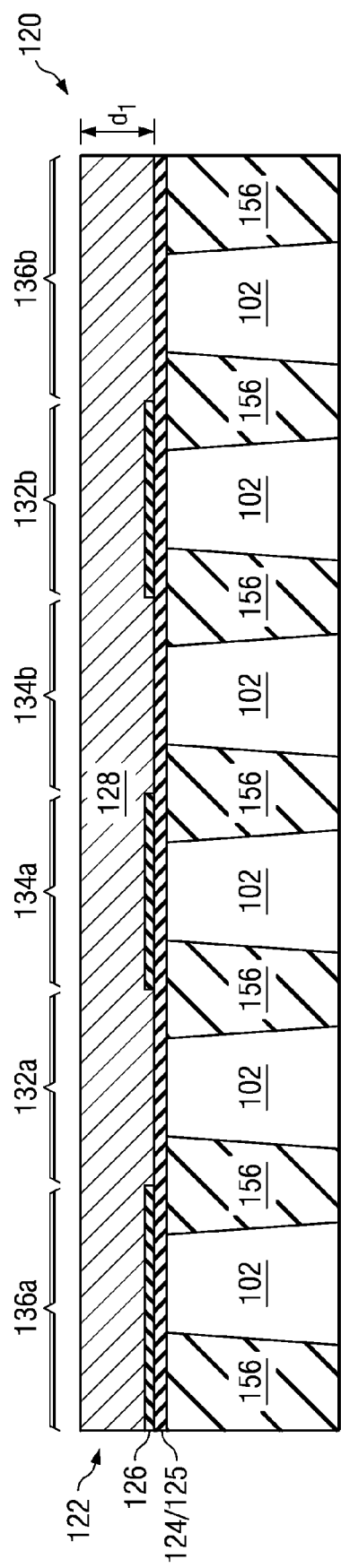
FIGS. 4 through 8 show cross-sectional views of a semiconductor device at various stages of manufacturing in accordance with an embodiment of the present invention, wherein multiple thicknesses of a metal gate layer and removal of a cap layer in some regions are used to create different threshold voltages for a plurality of transistors across a surface of a workpiece.

The workpiece 102 comprises a first region 132a, a second region 134a, a third region 136a, a fourth region 132b, a fifth region 134b, and a sixth region 136b that are separated from one another by isolation regions 156 formed in the workpiece 102, as shown in FIG. 4. The first region 132a is disposed between the second region 134a and the third region 136a. The fourth region 132b is disposed between the fifth region 134b and the sixth region 136b. The second region 134a is disposed adjacent the fifth region 134b, as shown.

After the optional interfacial layer and the gate dielectric material 124/125 are formed over the workpiece 102, a cap layer 126 is formed over the gate dielectric material 125. The cap layer 126 is patterned using lithography (e.g., by depositing a layer of photosensitive material (not shown) over the cap layer 126, patterning the layer of photosensitive material using a lithography mask and lithography exposure process, developing the layer of photosensitive material, using the layer of photosensitive material as an etch mask to etch away portions of the cap layer 126, and removing the layer of photosensitive material), removing the cap layer 126 from the first region 132a, the fifth region 134b, and the sixth region 136b, as shown in FIG. 4.

A metal gate material 128 is formed over the cap layer 126 and gate dielectric material 125, as shown in FIG. 4. The metal gate material 128 may comprise a first thickness or dimension $d_1$ comprising about 110 nm of TiN, as an example, although alternatively, the metal gate material 128 may comprise other materials and dimensions.

Figure 6:
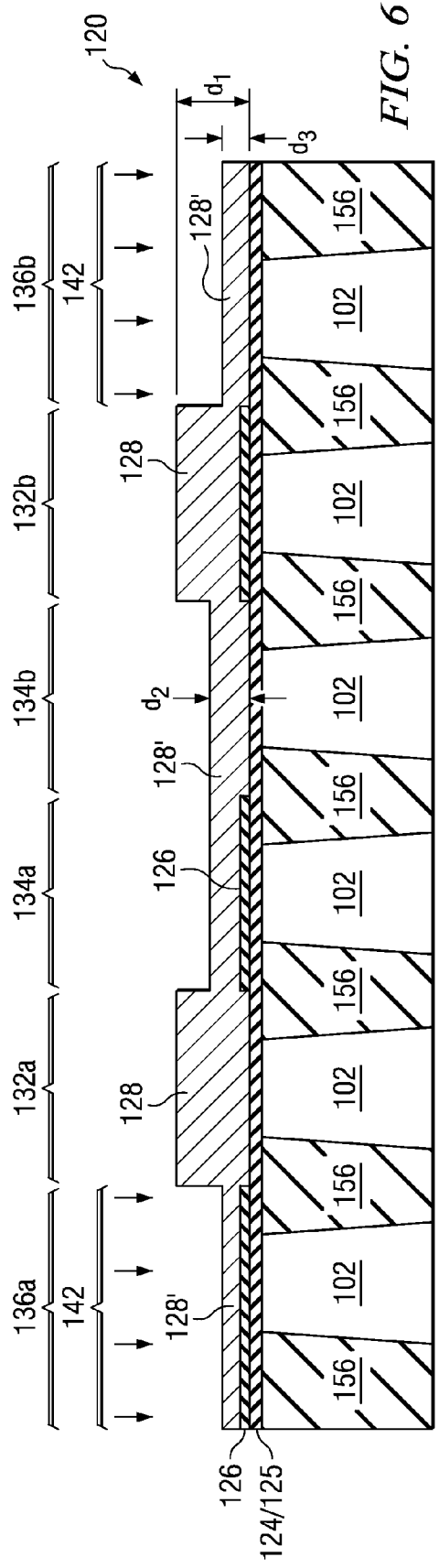

A first portion of the metal gate material 128 is removed using lithography (e.g., process 140) in the second region 134a and the fifth region 134b, leaving a metal gate material 128' in the second region 134a and fifth region 134b comprising a second thickness or dimension $d_2$ comprising about 70 nm, as an example, as shown in FIG. 5. A second portion of the metal gate material 128 is removed using lithography (e.g., process 142) in the third region 136a and the sixth region 136b, leaving a metal gate material 128' in the third region 136a and sixth region 136b comprising a third thickness or dimension $d_3$ comprising about 30 nm, as an example, as shown in FIG. 6. The second portion of the metal gate material 128 removed is larger than the first portion of the metal gate material 128 removed, for example, so that dimension $d_2$ is larger than dimension $d_3$, in some embodiments.

Figure 7:
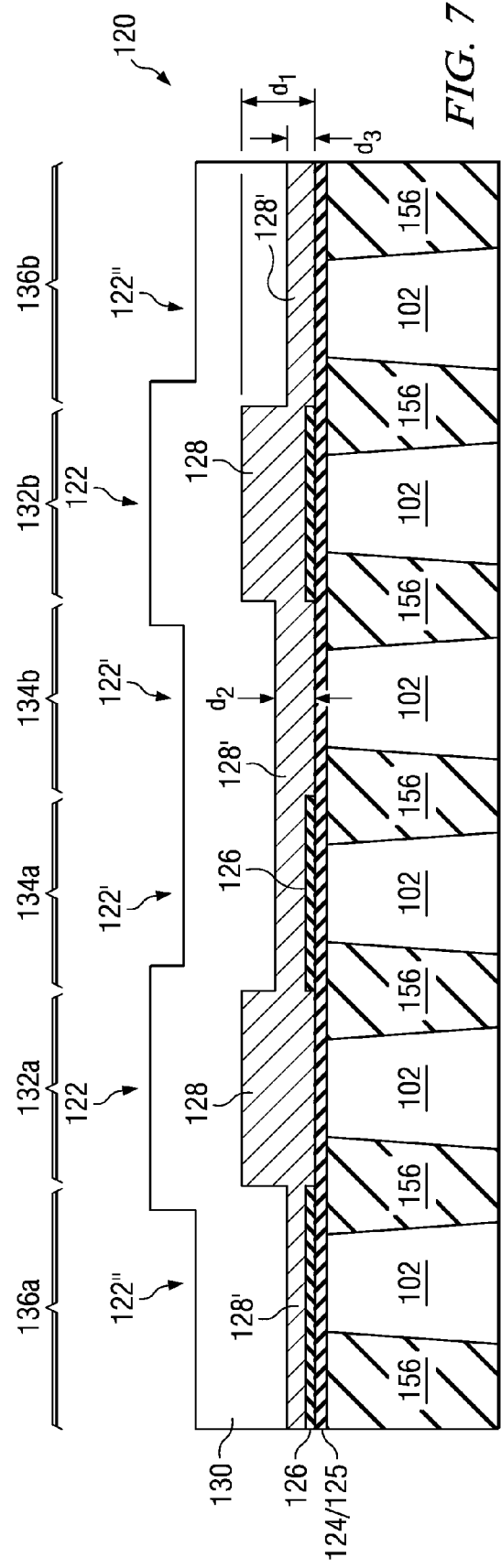
Figure 8:
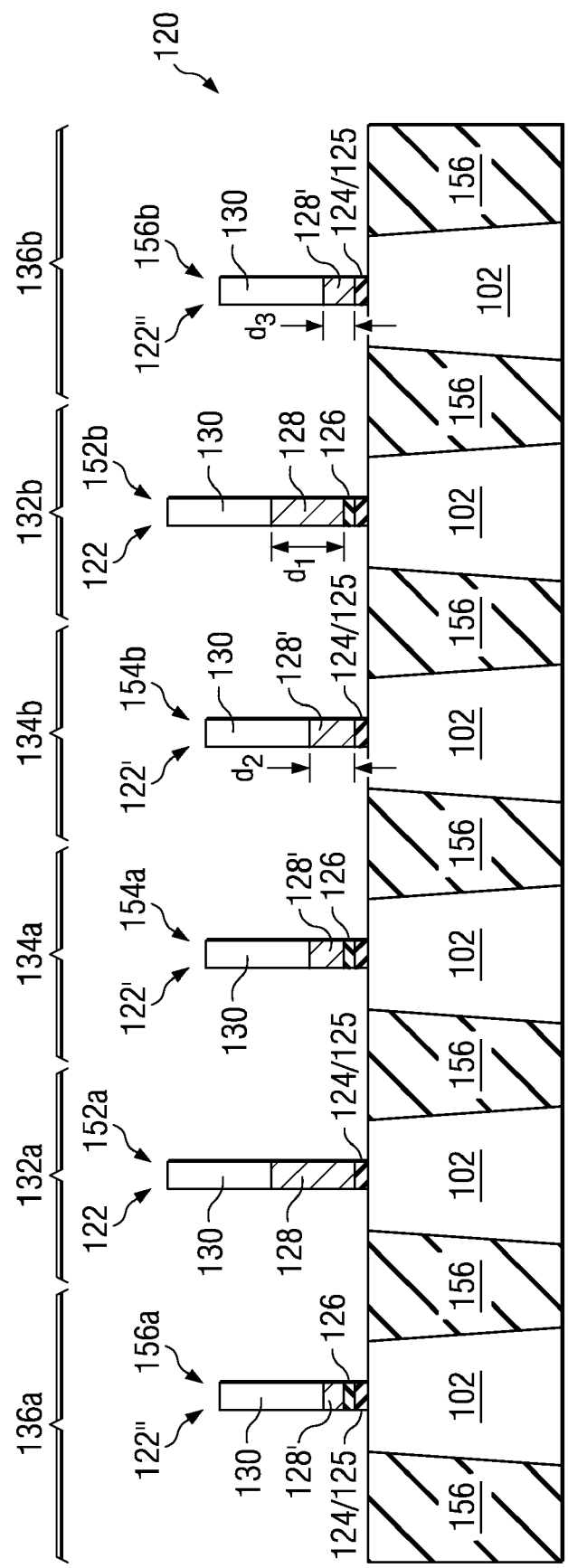

A semiconductive gate material 130 is formed over the metal gate material 128 and 128', as shown in FIG. 7. The semiconductive gate material 130, the metal gate material 128 and 128', the cap layer 126, and the interfacial layer and gate dielectric material 124/125 are patterned, as shown in FIG. 8, forming a first transistor 152a in the first region 132a, a second transistor 154a in the second region 134a, a third transistor 156a in the third region 136a, a fourth transistor 152b in the fourth region 132b, a fifth transistor 154b in the fifth region 134b, and a sixth transistor 156b in the sixth region 136b. Magnitudes of the threshold voltages for the first transistor 152a, second transistor 154a, third transistor 156b, fourth transistor 152b, fifth transistor 154b, and sixth transistor 156b of the semiconductor device 120 are different, due to the presence or non-presence of the cap layer 126 in some regions and due to the different thicknesses of the metal gate material 128/128'.

In one embodiment, the first transistor 152a comprises a low voltage p channel metal oxide semiconductor (PMOS) field effect transistor (FET) device, the second transistor 154a comprises a regular or medium voltage n channel metal oxide semiconductor (NMOS) FET device, and the third transistor 156a comprises a low voltage NMOS FET device. The fourth transistor 152b comprises a high voltage NMOS FET device, the fifth transistor 154b comprises a medium voltage PMOS FET device, and the sixth transistor 156b comprises a high voltage PMOS FET device, for example. The threshold voltage difference between the second and fifth transistors 154a and 154b and the first and third transistors 152a and 156a may be about −80 mV, and the threshold voltage difference between the second and fifth transistors 154a and 154b and the fourth and sixth transistors 152b and 156b may be about +80 mV, for example. Alternatively, the transistors 152a, 154a, 156a, 152b, 154b, and 156b may comprise other types of devices and may have threshold voltages that vary by other amounts.

The embodiment shown in FIGS. 4 through 8 advantageously results in the elimination of three mask levels. For example, rather than requiring a single mask level or six lithography masks for each of the six regions 132a, 132b, 134a, 134b, 136a, and 136b (e.g., if prior art implantation processes for the workpiece were used to establish the threshold voltages in each region, before forming the gate material stack 122), only three mask levels are required in accordance with the embodiment in FIG. 4 through 8: a first mask to pattern the cap layer 126, a second mask to remove the first portion of the metal gate material 128, and a third mask to remove the second portion of the metal gate material 128. Furthermore, damage to the surface of the workpiece 102 proximate channel regions of the transistors 152a, 152b, 154a, 154b, 156a, and 156c is avoided.

Embodiments of the present invention include methods of fabricating the semiconductor devices 120 described herein. Embodiments of the present invention also include semiconductor devices 120 manufactured using the methods described herein.

Advantages of embodiments of the invention include providing novel methods of forming semiconductor devices 120 and structures thereof. Fewer mask levels are required to form multiple transistors 152, 154, 156, 152a, 154a, 156b, 152b, 154b, and 156b of a semiconductor device 120 that have different magnitudes of threshold voltages. Some masking levels may be shared by regions or material layers to further reduce the number of mask levels, for example. Embodiments of the present invention are easily implementable into existing manufacturing process flows, with a small or reduced number of additional processing steps being required to fabricate the semiconductor devices 120.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   forming a gate dielectric material over a workpiece, the workpiece comprising a first region, a second region, a third region, a fourth region, a fifth region, and a sixth region;
   forming a cap layer over the gate dielectric material;
   removing the cap layer from over the gate dielectric material in the first region, the fifth region, and the sixth region;
   forming a metal gate material over the cap layer;
   removing a first portion of the metal gate material in the second region and the fifth region;
   removing a second portion of the metal gate material in the third region and the sixth region, the second portion being larger than the first portion;
   forming a semiconductive gate material over the metal gate material; and
   patterning the semiconductive gate material, the metal gate material, the cap layer, and the gate dielectric material, forming a first transistor in the first region, a second transistor in the second region, a third transistor in the third region, a fourth transistor in the fourth region, a fifth transistor in the fifth region, and a sixth transistor in the sixth region, wherein threshold voltages for the first transistor, second transistor, third transistor, fourth transistor, fifth transistor, and sixth transistor are different.

2. The method according to claim 1, wherein the first transistor comprises a low voltage p channel metal oxide semiconductor (PMOS) field effect transistor (FET) device, wherein the second transistor comprises a medium voltage n channel metal oxide semiconductor (NMOS) FET device, wherein the third transistor comprises a low voltage NMOS FET device, wherein the fourth transistor comprises a high voltage NMOS FET device, wherein the fifth transistor comprises a medium voltage PMOS FET device, and wherein the sixth transistor comprises a high voltage PMOS FET device.

3. The method according to claim 1, wherein forming the metal gate material comprises forming a material layer having a first thickness of about 110 nm, wherein removing the first portion of the metal gate material comprises leaving a metal gate material having a second thickness comprising about 70 nm in the second region and the fifth region, and wherein removing the second portion of the metal gate material comprises leaving a metal gate material having a third thickness comprising about 30 nm in the third region and the sixth region.

4. The method according to claim 3, wherein the threshold voltage difference between the second and fifth transistors and the first and third transistors is about −80 mV, and wherein the threshold voltage difference between the second and fifth transistors and the fourth and sixth transistors is about +80 mV.

5. A method of manufacturing a semiconductor device, the method comprising:
   forming a gate material stack over a workpiece, the workpiece comprising a first region, a second region, and a third region, the gate material stack comprising a plurality of material layers;
   altering a composition or a thickness of at least one of the plurality of material layers of the gate material stack in the second region and the third region of the workpiece;
   patterning the gate material stack in the first region, the second region and the third region of the workpiece; and
   forming a first transistor of a first conductivity type in the first region of the workpiece, forming a second transistor of the first conductivity type in the second region of the workpiece, and forming a third transistor of a second conductivity type in the second region of the workpiece, wherein altering the composition or the thickness of the at least one of the plurality of material layers of the gate material stack in the second region and the third region of the workpiece results in the first transistor of the first conductivity type having a first threshold voltage, the second transistor of the first conductivity type having a second threshold voltage, and the third transistor of the second conductivity type having a third threshold voltage, the second threshold voltage comprising a different magnitude than the first threshold voltage and the third threshold voltage comprising a different magnitude than the first threshold voltage or the second threshold voltage.

* * * * *